United States Patent
Sekiya

(10) Patent No.: US 10,056,296 B2
(45) Date of Patent: Aug. 21, 2018

(54) WORKPIECE PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/438,238

(22) Filed: Feb. 21, 2017

(65) Prior Publication Data

US 2017/0243787 A1    Aug. 24, 2017

(30) Foreign Application Priority Data

Feb. 22, 2016 (JP) .................................. 2016-031350

(51) Int. Cl.
| | |
|---|---|
| H01L 21/78 | (2006.01) |
| H01L 21/67 | (2006.01) |
| H01L 21/677 | (2006.01) |
| H01L 21/683 | (2006.01) |

(52) U.S. Cl.
CPC ........ *H01L 21/78* (2013.01); *H01L 21/67028* (2013.01); *H01L 21/67092* (2013.01); *H01L 21/67721* (2013.01); *H01L 21/6838* (2013.01)

(58) Field of Classification Search
CPC ............................ H01L 21/78; H01L 21/6838
See application file for complete search history.

(56) References Cited

U.S. PATENT DOCUMENTS

| | | | | |
|---|---|---|---|---|
| 5,351,872 A | * | 10/1994 | Kobayashi | ............. B23K 20/02 228/102 |
| 5,888,883 A | * | 3/1999 | Sasaki | ................. H01L 21/3043 257/E21.238 |
| 9,330,976 B2 | * | 5/2016 | Yakoo | ..................... H01L 21/78 |

FOREIGN PATENT DOCUMENTS

| | | |
|---|---|---|
| JP | 2001-023936 | 1/2001 |
| JP | 2013-065603 | 4/2013 |

* cited by examiner

*Primary Examiner* — Kyoung Lee
*Assistant Examiner* — Christina Sylvia
(74) *Attorney, Agent, or Firm* — Greer Burns & Crain Ltd.

(57) ABSTRACT

A processing method of processing a workpiece on which a plurality of intersecting planned dividing lines are set is provided. The processing method includes a holding step of holding the workpiece by a holding table, a dividing step of forming a plurality of chips by dividing the workpiece held by the holding table along the planned dividing lines, and a carrying-out step of, after the dividing step is performed, sucking the plurality of chips on the holding table by a suction unit including a suction head sucking the plurality of chips and a suction passage connected to the suction head, and carrying out the plurality of chips from the holding table via the suction passage.

1 Claim, 8 Drawing Sheets

WORKPIECE PROCESSING METHOD

BACKGROUND OF THE INVENTION

Field of the Invention

The present invention relates to a processing method for processing a workpiece such as a package substrate.

Description of the Related Art

A package substrate having a plurality of devices sealed by a resin is for example cut by a cutting blade along planned dividing lines referred to as streets or the like, and are thereby divided into a plurality of chips (packaged devices) corresponding to the respective devices. The chips after the division are for example arranged on a tray by a housing mechanism, and are sent for a next step (see for example Japanese Patent Laid-Open No. 2001-23936).

A dividing apparatus has also been proposed recently which realizes both of shortening of a time taken to house chips and simplification of a housing mechanism (see for example Japanese Patent Laid-Open No. 2013-65603). In this dividing apparatus, first, chips divided on a holding table are sucked and held by a suction pad, and transported to a drying table. The plurality of chips dried on the drying table are for example swept out by a brush and fall, and are then housed in a chip housing container below. According to this dividing apparatus, it is not necessary to pick up the chips one by one and arrange the chips on a tray. It is therefore possible to simplify the housing mechanism while shortening a time taken to house the chips.

SUMMARY OF THE INVENTION

However, the method of drying the chips after the division and then housing the chips in the container as described above requires at least a transporting step of transporting the chips to the drying table, a drying step of drying the chips, and a housing step of housing the chips in the container. In addition, because this method sweeps out the chips by the brush and houses the chips in the container, there is a strong possibility of losing chips having a small size, in particular.

It is accordingly an object of the present invention to provide a processing method that can easily carry out chips, and also reduce the possibility of losing the chips.

In accordance with an aspect of the present invention, there is provided a processing method of processing a workpiece on which a plurality of intersecting planned dividing lines are set, the processing method including: a holding step of holding the workpiece by a holding table; a dividing step of forming a plurality of chips by dividing the workpiece held by the holding table along the planned dividing lines; and a carrying-out step of, after the dividing step is performed, sucking the plurality of chips on the holding table by a suction unit including a suction head sucking the plurality of chips and a suction passage connected to the suction head, and carrying out the plurality of chips from the holding table via the suction passage.

In addition, in one mode of the present invention, it is preferable that in the carrying-out step, while a liquid is supplied to the plurality of chips, the plurality of chips be sucked by the suction unit together with the liquid, and the plurality of chips be carried out from the holding table via the suction passage.

The processing method according to one mode of the present invention sucks the plurality of chips on the holding table by the suction unit, and carries out the plurality of chips from the holding table via the suction passage of the suction unit. The chips can therefore be carried out easily as compared with the conventional method that requires the step of transportation to the drying table and the like. In addition, because the processing method according to one mode of the present invention carries out the plurality of chips via the suction passage, there is a small possibility of losing chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to one mode of the present invention will be described with reference to the accompanying drawings. A processing method according to the present embodiment includes a holding step (see FIG. 4A), a dividing step (see FIG. 4B), and a carrying-out step (see FIG. 5 and FIG. 6). In the holding step, a holding table holds a workpiece on which a plurality of planned dividing lines are set. In the dividing step, a plurality of chips are formed by dividing the workpiece held by the holding table along the planned dividing lines. In the carrying-out step, the plurality of chips on the holding table are sucked by a suction unit, and the plurality of chips are carried out from the holding table through a suction passage of the suction unit. The processing method according to the present embodiment will hereinafter be described in detail.

Figure 1:
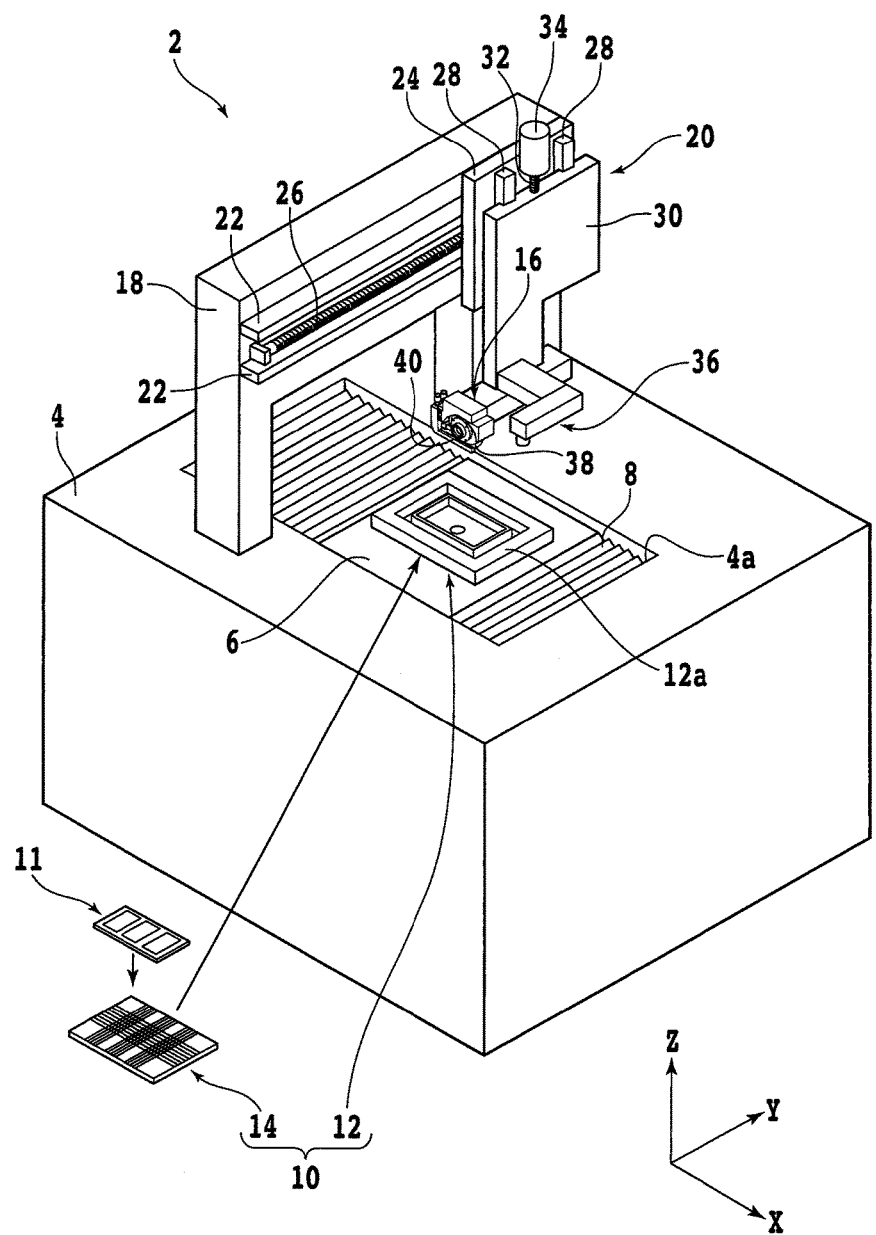
FIG. 1 is a perspective view schematically showing an example of constitution of a cutting apparatus.

An example of an apparatus used by the processing method according to the present embodiment will first be described. FIG. 1 is a perspective view schematically showing an example of constitution of a cutting apparatus. As shown in FIG. 1, the cutting apparatus 2 includes a base 4 that supports various structures. An opening 4a having a rectangular shape long in an X-axis direction (a front-rear direction, or a processing feed direction) is formed in an upper surface of the base 4. Provided inside the opening 4a are an X-axis moving table 6, an X-axis moving mechanism (not shown) that moves the X-axis moving table 6 in the X-axis direction, and a dustproof and dripproof cover 8 that covers the X-axis moving mechanism.

The X-axis moving mechanism includes a pair of X-axis guide rails (not shown) parallel with the X-axis direction. The X-axis moving table 6 is slidably attached to the X-axis guide rails. A nut portion (not shown) is provided on an under surface side of the X-axis moving table 6. An X-axis ball screw (not shown) parallel with the X-axis guide rails is screwed into this nut portion. An X-axis pulse motor (not shown) is coupled to one end portion of the X-axis ball screw. The X-axis moving table 6 is moved in the X-axis direction along the X-axis guide rails by rotating the X-axis ball screw by the X-axis pulse motor. A holding table (holding means) 10 for sucking and holding a plate-shaped workpiece 11 is disposed on the X-axis moving table 6. The holding table 10 includes a jig base 12 including a plurality of flow passages. The jig base 12 is coupled to a rotation-driving source (not shown) such as a motor, and is thereby rotated about a rotation axis substantially parallel with a Z-axis direction (vertical direction). A holding jig 14 corresponding to the workpiece 11 is mounted on an upper surface 12a of the jig base 12. Details of the holding table 10 will be described later.

Figure 2A:
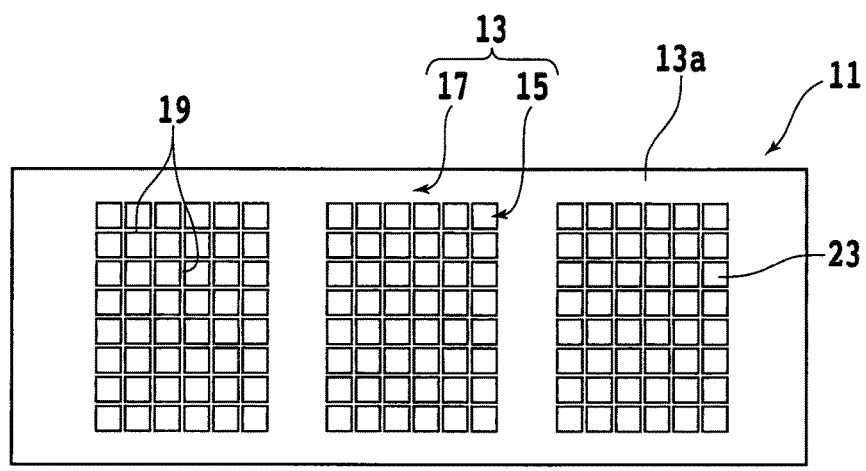
FIG. 2A is a plan view schematically showing an example of constitution of a workpiece.
Figure 2B:
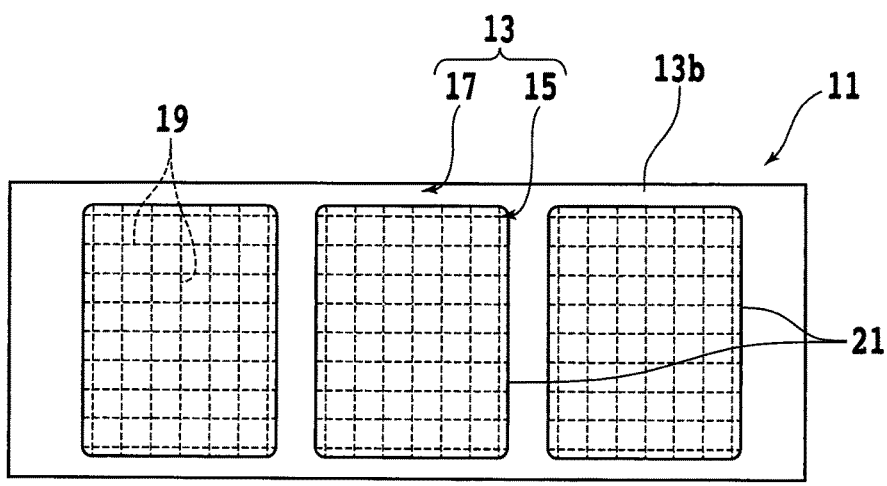
FIG. 2B is a bottom view schematically showing the example of constitution of the workpiece.

FIG. 2A is a plan view schematically showing an example of constitution of the workpiece 11. FIG. 2B is a bottom view schematically showing the example of constitution of the workpiece 11. As shown in FIG. 2A and FIG. 2B, the workpiece 11 includes a metal frame body 13 formed in a rectangular shape as viewed in plan. The metal frame body 13 is formed by a metal such for example as a 42 alloy (alloy of iron and nickel) or copper. The metal frame body 13 includes a plurality of device regions 15 (three device regions 15 in the present embodiment) and a peripheral surplus region 17 that surrounds the device regions 15. Each of the device regions 15 is further divided into a plurality of regions (48 regions in the present embodiment) by a plurality of intersecting planned dividing lines (streets) 19. A device (device chip) (not shown) such as an integrated circuit (IC), a light emitting diode (LED) or a microelectromechanical system (MEMS) is disposed in each of the plurality of regions. In addition, a resin layer 21 sealing the plurality of devices is disposed on an back surface 13b side of the metal frame body 13. The resin layer 21 is formed with a predetermined thickness, and for example projects slightly from the back surface 13b of the metal frame body 13. This resin layer 21 covers the whole on the back surface 13b side of each of the device regions 15. As shown in FIG. 2A, a plurality of stages 23 corresponding to the respective devices are arranged on a front surface 13a side of the metal frame body 13. A plurality of electrode pads (not shown) are formed on the periphery of each stage 23.

The workpiece 11 is for example obtained by disposing a device on each stage 23 from the back surface 13b side of the metal frame body 13, connecting electrodes of each device to the electrode pads arranged on the periphery of the stage 23 by metal wires (not shown) or the like, and thereafter sealing the back surface 13b side with the resin layer 21. A plurality of chips (packaged devices) sealed with the resin are completed by cutting and dividing the workpiece 11 along the planned dividing lines 19. Incidentally, while a package substrate having a rectangular shape as viewed in plan is used as the workpiece 11 in the present embodiment, there is no limitation to the material, shape, structure, or the like of the workpiece 11. For example, a semiconductor wafer, a resin substrate, a metal substrate, a ceramic substrate, or the like can also be used as the workpiece 11.

As shown in FIG. 1, a gate type supporting structure 18 for supporting a cutting unit 16 that cuts the workpiece 11 (cutting processing) is disposed on the upper surface of the base 4 so as to straddle the opening 4a. An upper portion of a front surface of the supporting structure 18 is provided with a cutting unit moving mechanism 20 that moves the cutting unit 16 in a Y-axis direction (a left-right direction, or an indexing feed direction) and the Z-axis direction (upward-downward direction). The cutting unit moving mechanism 20 includes a pair of Y-axis guide rails 22 that are arranged on the front surface of the supporting structure 18 and are parallel with the Y-axis direction. A Y-axis moving plate 24 constituting the cutting unit moving mechanism 20 is slidably attached to the Y-axis guide rails 22. A nut portion (not shown) is provided on an back surface side (rear surface side) of the Y-axis moving plate 24. A Y-axis ball screw 26 parallel with the Y-axis guide rails 22 is screwed into the nut portion. A Y-axis pulse motor (not shown) is coupled to one end portion of the Y-axis ball screw 26. When the Y-axis pulse motor rotates the Y-axis ball screw 26, the Y-axis moving plate 24 moves in the Y-axis direction along the Y-axis guide rails 22.

A pair of Z-axis guide rails 28 parallel with the Z-axis direction is provided on a surface (front surface) of the Y-axis moving plate 24. A Z-axis moving plate 30 is slidably attached to the Z-axis guide rails 28. A nut portion (not shown) is provided on an back surface side (rear surface side) of the Z-axis moving plate 30. A Z-axis ball screw 32 parallel with the Z-axis guide rails 28 is screwed into this nut portion. A Z-axis pulse motor 34 is coupled to one end portion of the Z-axis ball screw 32. When the Z-axis pulse motor 34 rotates the Z-axis ball screw 32, the Z-axis moving plate 30 moves in the Z-axis direction along the Z-axis guide rails 28.

The cutting unit 16 that cuts the workpiece 11 is disposed below the Z-axis moving plate 30. In addition, an imaging unit 36 such as a camera that images the upper surface side of the workpiece 11 is installed at a position adjacent to the cutting unit 16. The cutting unit 16 and the imaging unit 36 are indexing-fed when the cutting unit moving mechanism 20 moves the Y-axis moving plate 24 in the Y-axis direction. The cutting unit 16 and the imaging unit 36 are raised or lowered when the cutting unit moving mechanism 20 moves the Z-axis moving plate 30 in the Z-axis direction. The cutting unit 16 includes an annular cutting blade 38 mounted on one end side of a spindle (not shown). A rotation-driving source (not shown) such as a motor is coupled to another end side of the spindle. The cutting blade 38 is rotated by a rotational force transmitted from the rotation-driving source via the spindle. In addition, a cutting liquid supplying nozzle 40 that supplies a cutting liquid such as pure water to the cutting blade 38 and the workpiece 11 is disposed in the vicinity of the cutting blade 38.

Figure 3A:
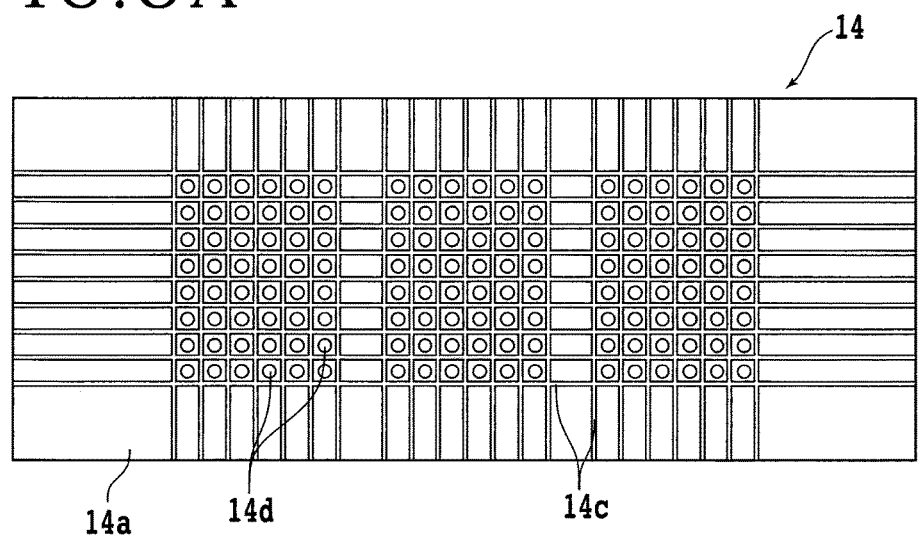
FIG. 3A is a plan view schematically showing a holding jig.
Figure 3B:
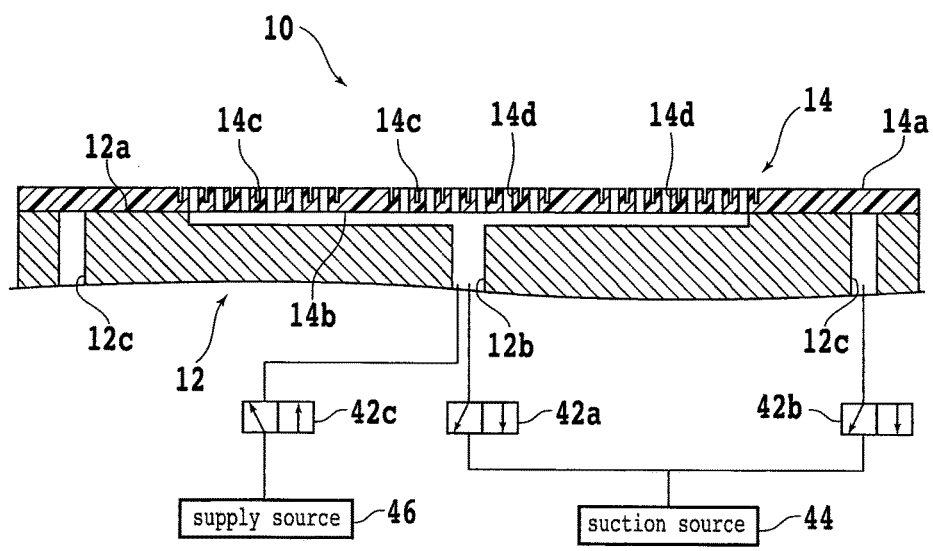
FIG. 3B is a diagram schematically showing an example of constitution of a holding table including a jig base and the holding jig.

FIG. 3A is a plan view schematically showing the holding jig 14. FIG. 3B is a diagram schematically showing an example of constitution of the holding table 10 including the jig base 12 and the holding jig 14. As shown in FIG. 3A and FIG. 3B, the holding jig 14 is a rectangular-shaped flat plate made of a material such as a resin. An upper surface of the holding jig 14 is a holding surface 14a for sucking and holding the workpiece 11. Clearance grooves 14c corresponding to the planned dividing lines 19 of the workpiece 11 are formed on the holding surface 14a side of the holding jig 14. Upper ends of the clearance grooves 14c open to the holding surface 14a. The clearance grooves 14c divide the holding surface 14a into the plurality of regions corresponding to the workpiece 11 after division. The width of the clearance grooves 14c is larger than the width of the cutting blade 38. The depth of the clearance grooves 14c is larger than the cutting depth of the cutting blade 38. Therefore, the holding jig 14 and the cutting blade 38 do not come into contact with each other even when the cutting blade 38 is made to cut in deeply at a time of cutting the workpiece 11 along the planned dividing lines 19. Incidentally, the holding jig 14 is formed with a thickness larger than the depth of the clearance grooves 14c.

A through hole 14d that vertically penetrates the holding jig 14 and opens to the holding surface 14a is formed in each of the regions demarcated by the clearance grooves 14c. As shown in FIG. 3B, when the holding jig 14 is placed on the upper surface 12a of the jig base 12, each through hole 14d is connected to a first flow passage 12b formed in a central part on the upper surface 12a side of the jig base 12. The first flow passage 12b is connected to a suction source 44 via an opening and closing valve 42a. The workpiece 11 can therefore be sucked and held by the holding table 10 when the opening and closing valve 42a is opened in a state in which the workpiece 11 is stacked on the holding surface 14a of the holding jig 14 placed on the upper surface 12a of the jig base 12 and the planned dividing lines 19 of the workpiece 11 are made to coincide with the clearance grooves 14c.

Incidentally, a second flow passage 12c for mounting the holding jig 14 on the jig base 12 is formed in an outer peripheral part of the jig base 12. This second flow passage 12c is connected to the suction source 44 via an opening and closing valve 42b. The holding jig 14 can therefore be fixed on the upper surface 12a of the jig base 12 when an under surface 14b of the holding jig 14 is brought into contact with the upper surface 12a of the jig base 12 and the opening and closing valve 42b is opened as shown in FIG. 3B. In addition, a fluid supply source 46 is connected to the first flow passage 12b via an opening and closing valve 42c. In the processing method according to the present embodiment, a fluid supplied from the supply source 46 is used to carry out the chips after division from the holding table 10. There is no limitation to a kind or the like of the fluid supplied from the supply source 46. However, for example, when a liquid as the fluid is supplied from the supply source 46, the chips being transported are easily prevented from being damaged. This will be described later in detail.

Figure 4A:
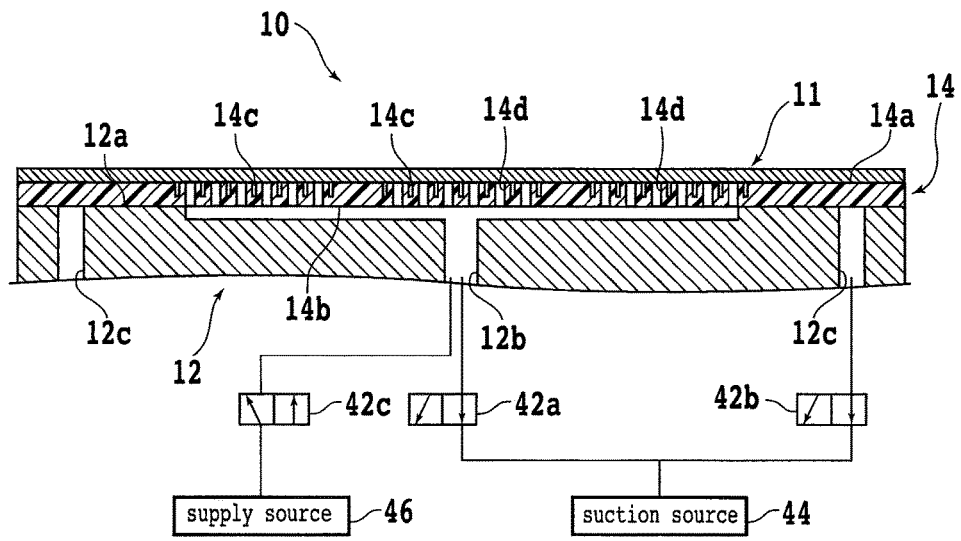
FIG. 4A is a diagram of assistance in explaining a holding step.

The processing method according to the present embodiment will next be described. The processing method according to the present embodiment first performs a holding step of holding, by the holding table 10, the workpiece 11 having the plurality of planned dividing lines 19 set thereon. FIG. 4A is a diagram of assistance in explaining the holding step. In the holding step, first, the workpiece 11 is laid on the holding surface 14a such that the planned dividing lines 19 coincide with the clearance grooves 14c. Next, the opening and closing valve 42a is opened to make a negative pressure of the suction source 44 act on the workpiece 11. The workpiece 11 is thereby sucked and held by the holding table 10.

Figure 4B:
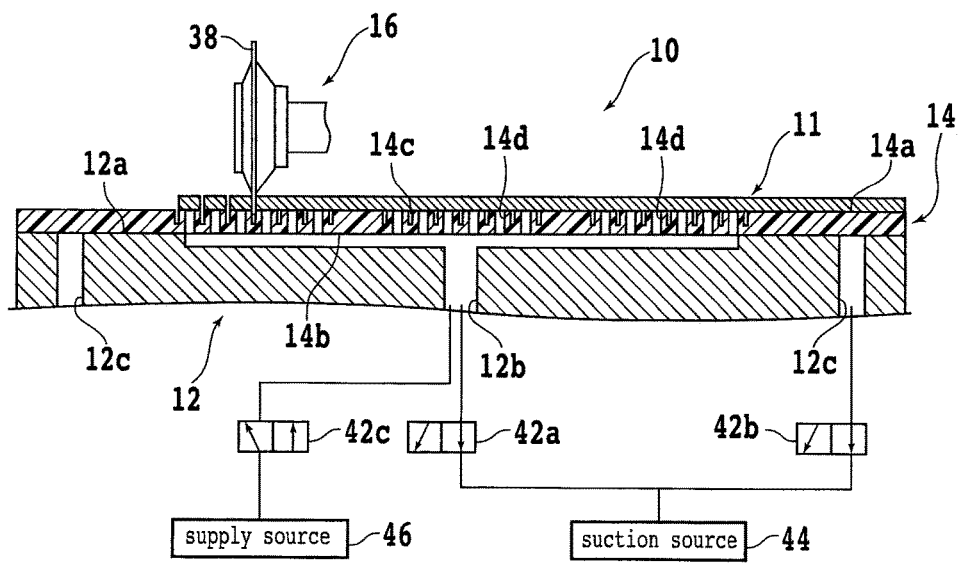
FIG. 4B is a diagram of assistance in explaining a dividing step.

After the holding step, a dividing step is performed which forms a plurality of chips by dividing the workpiece 11 along the planned dividing lines 19. FIG. 4B is a diagram of assistance in explaining the dividing step. In this dividing step, first, the holding table 10 and the cutting blade 38 are moved and rotated relative to each other, and the cutting blade 38 is set on an extension of a planned dividing line 19 extending in a first direction, for example. Next, the cutting blade 38 is lowered to such a height as to enter the clearance groove 14c. Then, the rotated cutting blade 38 and the holding table 10 are moved relative to each other in a direction parallel with the target planned dividing line 19. The cutting blade 38 is thereby made to cut in along the target planned dividing line 19, so that the workpiece 11 can be divided. After the workpiece 11 is divided along the target planned dividing line 19, the holding table 10 and the cutting blade 38 are moved relative to each other, and the cutting blade 38 is set on an extension of an adjacent planned dividing line 19, for example. Then, the rotated cutting blade 38 and the holding table 10 are moved relative to each other in a direction parallel with the planned dividing line 19. The cutting blade 38 is thereby made to cut in along the planned dividing line 19, so that the workpiece 11 can be further divided. After the above-described procedure is repeated, and thereby the workpiece 11 is divided along all of the planned dividing lines 19 extending in the first direction, for example, the holding table 10 is rotated, and the workpiece 11 is divided along the planned dividing lines 19 extending in a second direction. The dividing step is ended when a plurality of chips 31 (see FIG. 5 or the like) are formed by dividing the workpiece 11 along all of the planned dividing lines 19.

Figure 5:
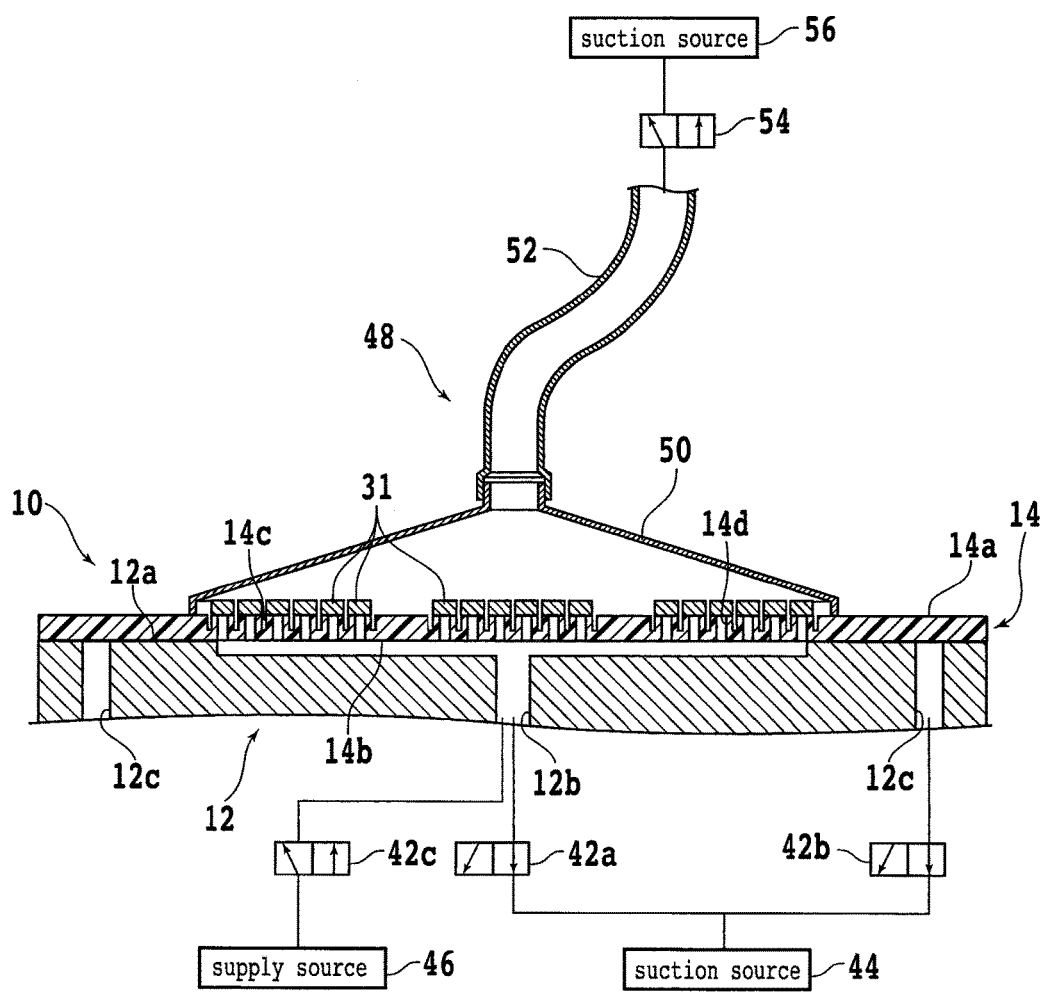
FIG. 5 is a diagram of assistance in explaining a carrying-out step.
Figure 6:
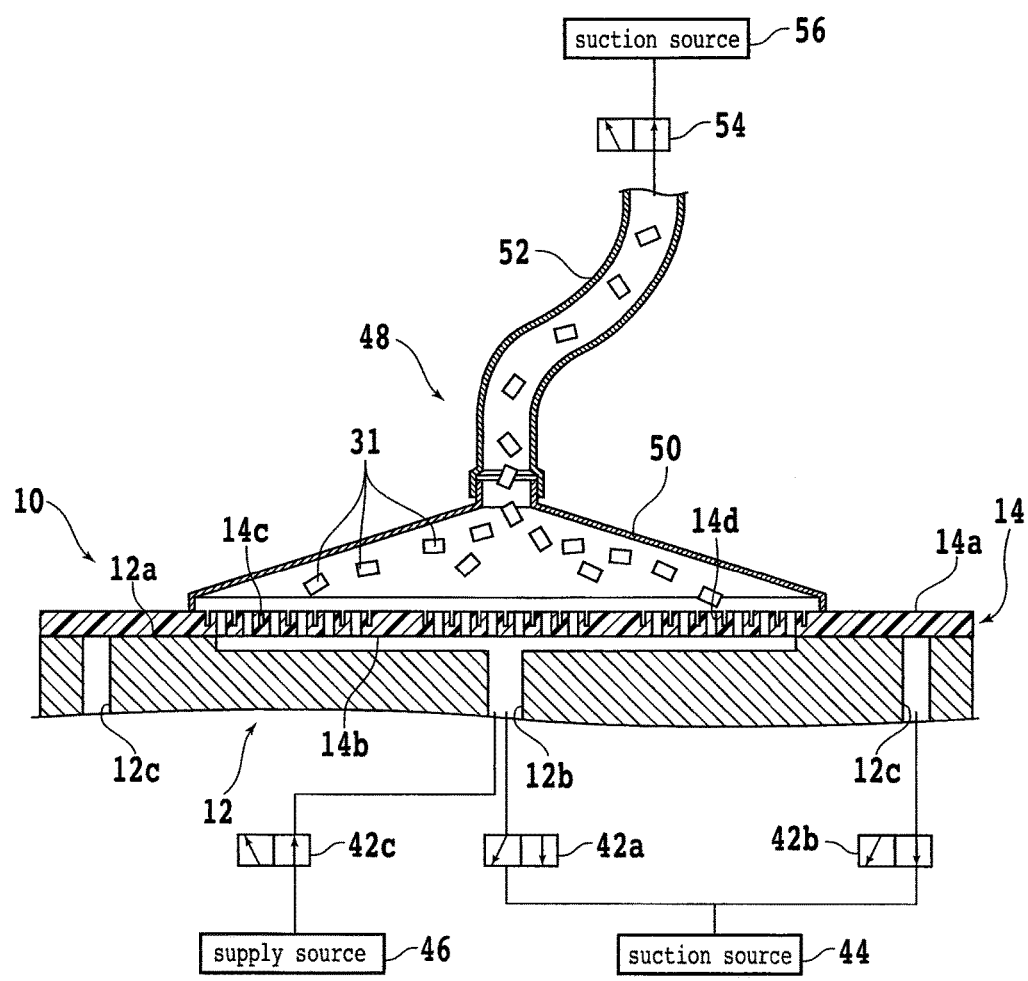
FIG. 6 is a diagram of assistance in explaining the carrying-out step.

After the dividing step, a carrying-out step is performed which carries out the plurality of chips 31 on the holding table 10. FIG. 5 and FIG. 6 are diagrams of assistance in explaining the carrying-out step. The carrying-out step according to the present embodiment is performed by using a suction unit (suction means) 48 shown in FIG. 5 and FIG. 6, for example. The suction unit 48 includes a pyramidal (conoid) suction head 50 disposed so as to cover at least a part of the holding table 10. An opening is formed at a lower end of the suction head 50. When the suction head 50 is placed on the holding table 10, the plurality of chips 31 are housed within the opening. An upper end portion of the suction head 50 is connected with one end side of a suction passage 52 formed by piping or the like. Another end side of the suction passage 52 is connected with a suction source 56 via an opening and closing valve 54. Therefore, when the opening and closing valve 54 is opened, the plurality of chips 31 can be sucked by making a negative pressure of the suction source 56 act on the opening of the suction head 50.

In the carrying-out step, first, as shown in FIG. 5, the suction head 50 is placed on the holding table 10, and the plurality of chips 31 are housed within the opening of the suction head 50. At this time, the opening and closing valve 54 is set in a closed state. That is, the negative pressure of the suction source 56 is not made to act on the opening of the suction head 50 at this time. Next, as shown in FIG. 6, after the negative pressure of the suction source 44 for the chips 31 is blocked by closing the opening and closing valve 42a, the negative pressure of the suction source 56 is made to act on the suction head 50 by opening the opening and closing valve 54. In addition, the opening and closing valve 42c is opened to supply the fluid of the supply source 46 to the first flow passage 12b. A flow of a gas or a liquid toward the suction source 56 can be thereby produced inside the suction head 50 and the suction passage 52. The plurality of chips 31 are carried out from the holding table 10 along with the flow of the gas or the liquid. A housing container (not shown) for housing the plurality of chips 31, for example, is disposed on the other end side of the suction passage 52. The plurality of chips 31 on the holding table 10 are carried out from the holding table 10 along with the flow of the gas or the liquid which flow is produced inside the suction head 50 and the suction passage 52, and the plurality of chips 31 are housed in the housing container. Incidentally, in this carrying-out step, the plurality of chips 31 can also be transported directly to a work area for a next step. In that case, the housing container does not necessarily need to be disposed on the other end side of the suction passage 52.

As described above, there is no limitation to the kind or the like of the fluid supplied from the supply source 46. For example, when a gas such as air is supplied from the supply source 46, an air flow suitable for carrying out the chips 31 can be generated inside the suction head 50 and the suction passage 52. The plurality of chips 31 can be thereby carried out appropriately. On the other hand, when a liquid such as pure water is supplied from the supply source 46, a flow of the liquid is produced inside the suction head 50 and the suction passage 52. The plurality of chips 31 can be thereby carried out appropriately along with the flow of the liquid. In this case, the liquid functions as a cushioning material, and can therefore also prevent damage to the chips 31 which damage may be caused by collision or the like.

As described above, the processing method according to the present embodiment sucks the plurality of chips 31 on the holding table 10 by the suction unit (suction means) 48, and carries out the plurality of chips 31 from the holding table 10 via the suction passage 52 of the suction unit 48. The chips 31 can therefore be carried out easily as compared with the conventional method that requires a step of transportation to a drying table or the like. In addition, the processing method according to the present embodiment carries out the plurality of chips 31 via the suction passage 52. There is thus a small possibility of losing chips 31.

It is to be noted that the present invention is not limited to the description of the foregoing embodiment, but can be changed and carried out in various manners. For example, while the foregoing embodiment uses the suction head 50 in a mode of covering all of the chips 31 formed in the dividing step, it is also possible to use a suction head 50 in a mode of covering one or a plurality of chips 31.

Figure 7:
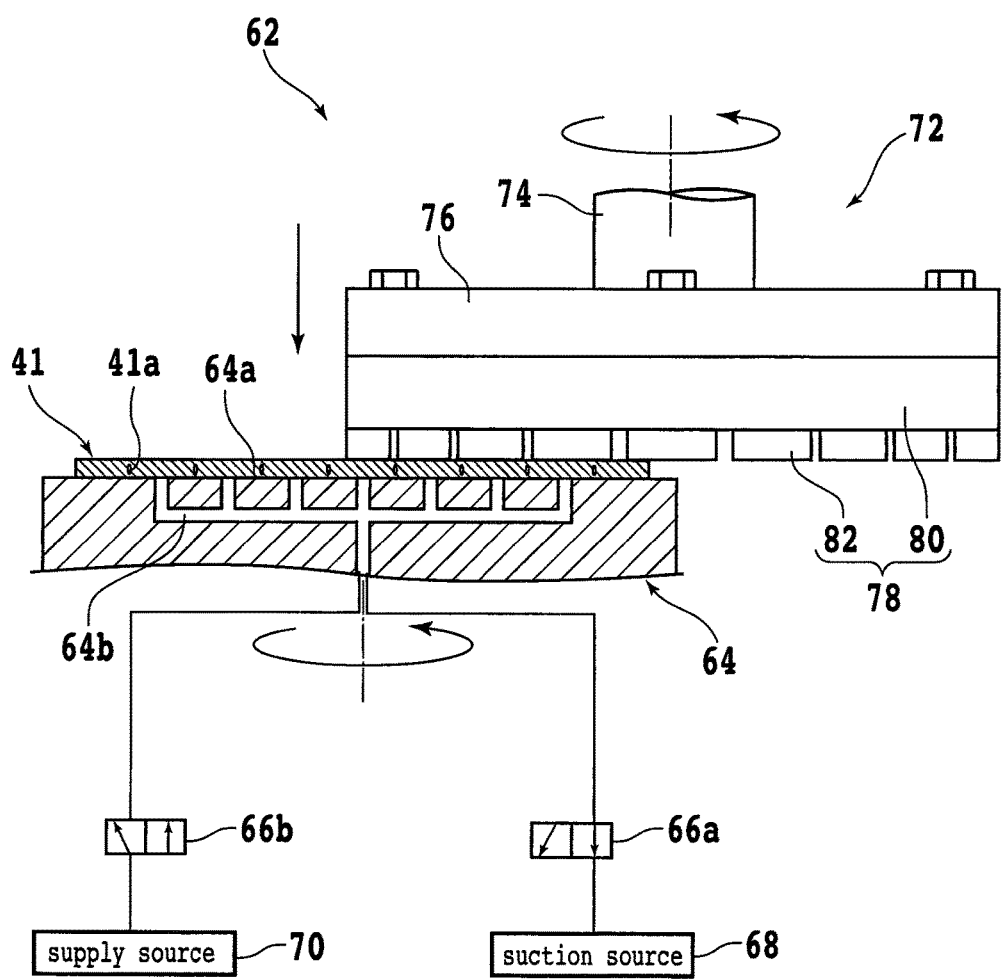
FIG. 7 is a diagram of assistance in explaining a dividing step according to a modification.

In addition, while the foregoing embodiment cuts the workpiece 11 by the cutting blade 38, a workpiece in which a starting point of division is formed can be divided by a method such as grinding. FIG. 7 is a diagram of assistance in explaining a dividing step according to a modification. As shown in FIG. 7, a workpiece 41 according to the modification is for example a disk-shaped semiconductor wafer formed of a material such as silicon, and a front surface side of the workpiece 41 is divided into a plurality of regions by a plurality of intersecting planned dividing lines (not shown). Here, there is no limitation to the material, shape, structure, or the like of the workpiece 41. In addition, a modified layer 41a serving as a starting point of division is formed within the workpiece 41. The modified layer 41a is for example formed along the planned dividing lines by a method of condensing a laser beam of a wavelength transparent to the workpiece 41. Incidentally, in place of the modified layer 41a, grooves or the like serving as a starting point of division may be formed by a method of half cutting the workpiece 41 by a cutting blade or a laser beam.

The dividing step according to the modification is performed by using a grinding apparatus 62 shown in FIG. 7, for example. The grinding apparatus 62 includes a holding table (holding means) 64 for sucking and holding the workpiece 41. The holding table 64 is coupled to a rotation-driving source (not shown) including a motor or the like, and is rotated about a rotation axis substantially parallel with a vertical direction. In addition, a moving mechanism (not shown) is provided below the holding table 64. The holding table 64 is moved in a horizontal direction by this moving mechanism. An upper surface of the holding table 64 is a holding surface 64a that sucks and holds the workpiece 41. One end side of a flow passage 64b opens at positions corresponding to the respective regions demarcated by the planned dividing lines of the workpiece 41 in the holding surface 64a. Another end side of the flow passage 64b is connected with a suction source 68 via an opening and closing valve 66a. This end side of the flow passage 64b is also connected with a supply source 70 via an opening and closing valve 66b.

A grinding unit 72 is disposed above the holding table 64. The grinding unit 72 includes a spindle housing (not shown) supported by a raising and lowering mechanism (not shown). The spindle housing houses a spindle 74. A disk-shaped mount 76 is fixed to a lower end portion of the spindle 74. A grinding wheel 78 having a substantially same diameter as the mount 76 is fitted to an under surface of the mount 76. The grinding wheel 78 includes a wheel base 80 formed of a metallic material such as a stainless steel or aluminum. A plurality of grinding stones 82 are arranged annularly on an under surface of the wheel base 80. A rotation-driving source (not shown) such as a motor is coupled to an upper end side (base end side) of the spindle 74. The grinding wheel 78 is rotated about a rotation axis substantially parallel with the vertical direction by a rotational force generated by the rotation-driving source.

In the dividing step, first, the front surface side of the workpiece 41 is brought into contact with the holding surface 64a of the holding table 64, and the opening and closing valve 66a is opened. A negative pressure of the suction source 68 is thereby made to act on the holding surface 64a, so that the workpiece 41 can be sucked and held by the holding table 64. Incidentally, the opening and closing valve 66b is closed in the dividing step. Next, the holding table 64 is moved to a position below the grinding unit 72. Then, as shown in FIG. 7, the spindle housing (spindle 74) is lowered while the holding table 64 and the grinding wheel 78 are each rotated. An amount of lowering of the spindle housing is adjusted to such a degree that under surfaces of the grinding stones 82 are pressed against the back surface side of the workpiece 41, for example. The back surface side can be thereby ground to thin the workpiece 41. Incidentally, the workpiece 41 is divided along the modified layer 41a due to an external force applied at the time of this grinding. The dividing step is ended when the workpiece 41 is thinned to a finished thickness and divided into a plurality of chips 51 (see FIG. 8).

Figure 8:
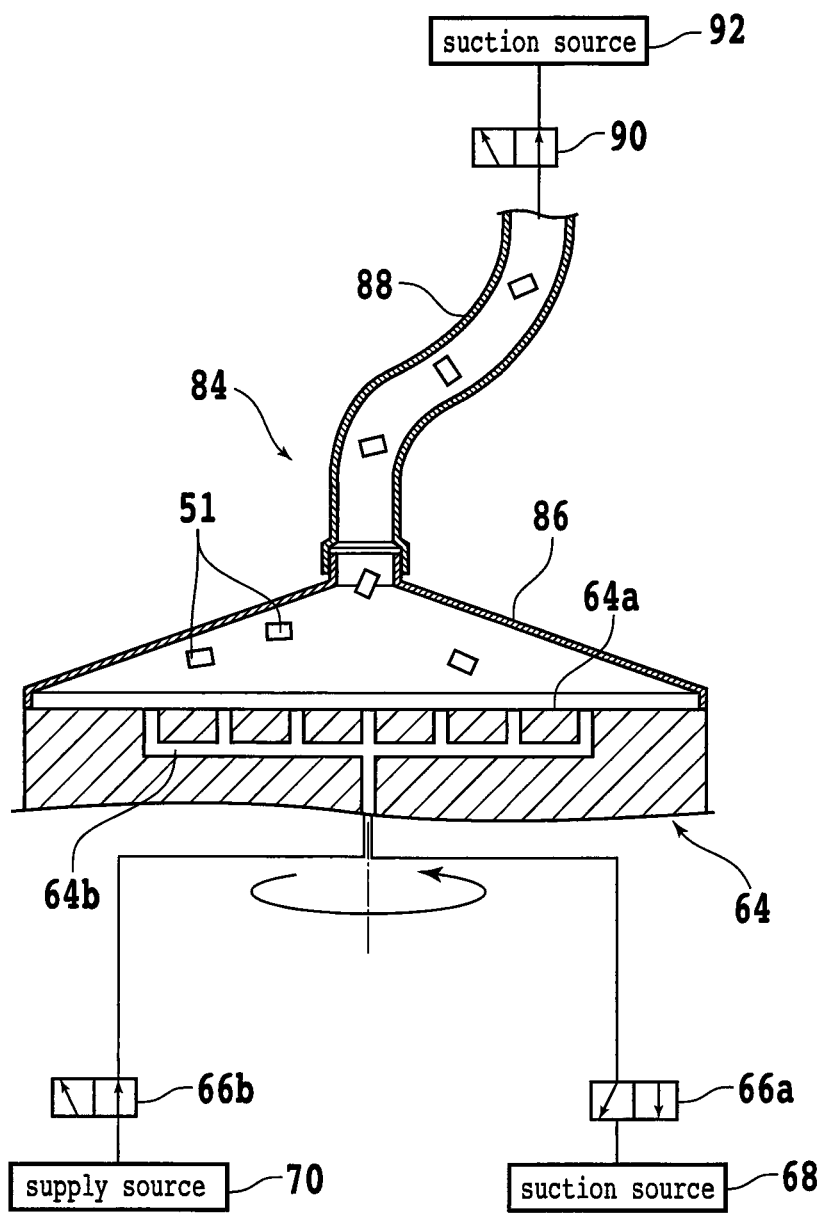
FIG. 8 is a diagram of assistance in explaining a carrying-out step according to the modification.

After the dividing step, a carrying-out step is performed which carries out the plurality of chips 51 on the holding table 64. FIG. 8 is a diagram of assistance in explaining the carrying-out step according to the modification. The carrying-out step according to the present embodiment is performed by using a suction unit (suction means) 84 shown in FIG. 8, for example. The suction unit 84 has a constitution similar to the constitution of the suction unit 48. Specifically, the suction unit 84 includes a suction head 86. An opening is formed at a lower end of the suction head 86. When the suction head 86 is placed on the holding table 64, the plurality of chips 51 are housed within the opening. An upper end portion of the suction head 86 is connected with one end side of a suction passage 88. Another end side of the suction passage 88 is connected with a suction source 92 via an opening and closing valve 90.

In the carrying-out step according to the modification, first, the suction head 86 is placed on the holding table 64, and the plurality of chips 51 are housed within the opening of the suction head 86. At this time, the opening and closing valve 90 is set in a closed state. That is, the negative pressure of the suction source 92 is not made to act on the opening of the suction head 86 at this time. Next, after the negative pressure of the suction source 68 for the chips 51 is blocked by closing the opening and closing valve 66a, the negative pressure of the suction source 92 is made to act on the suction head 86 by opening the opening and closing valve 90. In addition, the opening and closing valve 66b is opened to supply the fluid of the supply source 70 to the flow passage 64b. A flow of a gas or a liquid toward the suction source 92 can be thereby produced inside the suction head 86 and the suction passage 88. The plurality of chips 51 are carried out from the holding table 64 along with the flow of the gas or the liquid.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of processing a workpiece on which a plurality of intersecting planned dividing lines are set, the processing method comprising:

a holding step of holding the workpiece by a holding table;

a dividing step of forming a plurality of chips by dividing the workpiece held by the holding table along the planned dividing lines; and a carrying-out step of, after the dividing step is performed, sucking the plurality of chips on the holding table by a suction unit including a suction head sucking the plurality of chips and a suction passage connected to the suction head, and carrying out the plurality of chips from the holding table via the suction passage, wherein, in the carrying-out step, while a liquid is supplied to the plurality of chips, the plurality of chips are sucked by the suction unit together with the liquid, and the plurality of chips are carried out from the holding table via the suction passage.

* * * * *